(12) United States Patent
Murray et al.

(10) Patent No.: US 8,539,409 B1
(45) Date of Patent: Sep. 17, 2013

(54) SIMULTANEOUS DEVELOPMENT OF COMPLEMENTARY IC FAMILIES

(75) Inventors: Shawn Murray, Portland, OR (US);
John Schadt, Bethlehem, PA (US);
Steven J. Fong, Santa Clara, CA (US);
Luan Phoc Chau, Portland, OR (US);
Thomas R. Gustafson, Banks, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 98 days.

(21) Appl. No.: 13/178,599

(22) Filed: Jul. 8, 2011

(51) Int. Cl.
*G06F 17/50* (2006.01)

(52) U.S. Cl.
USPC .......................... 716/110; 716/100; 716/104

(58) Field of Classification Search
USPC ........................ 716/100, 101, 104, 110, 116
See application file for complete search history.

(56) References Cited

U.S. PATENT DOCUMENTS

| | | | |
|---|---|---|---|
| 5,693,540 A * | 12/1997 | Turner et al. .................... | 438/10 |
| 5,783,846 A * | 7/1998 | Baukus et al. .................. | 257/204 |
| 6,406,980 B1 | 6/2002 | Amatangelo et al. | |
| 6,472,926 B2 * | 10/2002 | Taito et al. ..................... | 327/536 |
| 6,475,850 B2 | 11/2002 | Violette et al. | |
| 6,922,823 B2 * | 7/2005 | Tester ............................ | 716/112 |
| 7,137,092 B2 * | 11/2006 | Maeda ............................ | 716/53 |
| 7,402,482 B2 | 7/2008 | Weiner | |
| 7,844,923 B2 * | 11/2010 | Yoshimoto et al. ........... | 716/102 |
| 8,151,224 B1 | 4/2012 | Ang et al. | |
| 8,200,233 B2 * | 6/2012 | Kim et al. ..................... | 455/448 |
| 2012/0131533 A1 * | 5/2012 | Marinet ......................... | 716/122 |

* cited by examiner

*Primary Examiner* — Sun Lin (57) ABSTRACT

Two (or more) different, but complementary, families of integrated circuits having the same layout are developed simultaneously where the different families are achieved by changing one or more design parameters of transistors used to implement the integrated circuits. For example, a low-power (but low-speed) family of one or more ICs (e.g., for handheld applications) can be achieved by designing at least some transistors with relatively high threshold-voltage (Vt) levels, while a different, but complementary, high-speed (but high-power) family of one or more ICs (e.g., for server applications) can be achieved by designing corresponding transistors with relatively low Vt levels. In this way, the two families can share in common all but a very few masks used to fabricate the ICs of the different families.

25 Claims, 10 Drawing Sheets

FIG. 1

| TABLE I. DEVELOPMENT FLOW | | | |
|---|---|---|---|
| | TASK | SINGLE FAMILY | TWO FAMILIES |
| (1) | SPECIFICATION WRITING | 3 MONTHS | 3 MONTHS |
| (2) | BLOCK DESIGN | 6 MONTHS | 8 MONTHS |
| (3) | BLOCK LAYOUT | 3 MONTHS | 4 MONTHS |
| (4) | CHIP ASSEMBLY AND VERIFICATION | 4 MONTHS | 5 MONTHS |
| (5) | 1st MASK ORDER, WAFER FAB PROCESSING | 3 MONTHS | 3 MONTHS |
| (6) | PHASE ONE TESTING AND VALIDATION (ATE TEST, BENCH TEST, VALIDATION, CHARACTERIZATION, WRITE REPORTS, REVIEW) | 6 MONTHS | 6 MONTHS |
| (7) | DEBUGGING, 2nd MASK ORDER, WAFER FAB PROCESSING | 3 MONTHS | 3 MONTHS |
| (8) | PHASE TWO TESTING AND VALIDATION | 2 MONTHS | 2 MONTHS |
| (9) | SPLIT LOT RUNS (FULL ESD, RELIABILITY, AND QA RUNS); QA REPORT WRITING AND REVIEW | 6 MONTHS | 6 MONTHS |
| (10) | MASK ORDERS FOR OTHER MEMBERS OF FAMILY (i.e., FOLLOW-ON DEVICES) | 3 MONTHS PER DEVICE | 3 MONTHS PER DEVICE |
| (11) | TESTING AND VALIDATION OF EACH FOLLOW-ON DEVICE | 3 MONTHS PER DEVICE | 3 MONTHS PER DEVICE |

(Related Art)

FIG. 2

| TASK | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| STANDARD DEVELOPMENT FLOW | | | | | | | | | | | | | | | | |
| (1) WRITE SPECIFICATION, 3 MONTHS | | ▨ | | | | | | | | | | | | | | |
| (2) DESIGN BLOCKS, 6 MONTHS | | | | ▨ | ▨ | ▨ | ▨ | ▨ | ▨ | | | | | | | |
| (3) LAYOUT BLOCKS, 3 MONTHS | | | | | | | | | | ▨ | ▨ | | | | | |
| (4) ASSEMBLE CHIP AND VERIFY, 4 MONTHS | | | | | | | | | | | | | ▨ | ▨ | ▨ | |
| (5) MASK ORDER, PROCESS WAFERS, LEAD CHIP OUT, 3 MONTHS | | | | | | | | | | | | | | | | |
| (6) ATE TEST AND VALIDATION, 6 MONTHS | | | | | | | | | | | | | | | | |
| (7) FIND BUGS, 2nd MASK ORDER, FAB PROCESSING, 3 MONTHS | | | | | | | | | | | | | | | | |
| (8) PHASE TWO TESTING, 2 MONTHS | | | | | | | | | | | | | | | | |
| ENGINEERING SAMPLES AVAILABLE | | | | | | | | | | | | | | | | |
| (9) RUN SPLIT LOTS, RUN QA AND RELIABILITY RUNS, 6 MONTHS | | | | | | | | | | | | | | | | |
| (10) MASK ORDER, PROCESS WAFERS, 1st FOLLOW ON, 3 MONTHS | | | | | | | | | | | | | | | | |
| (11) ATE TEST AND VALIDATION 1st FOLLOW ON, 3 MONTHS | | | | | | | | | | | | | | | | |
| (10) MASK ORDER, PROCESS WAFERS, 2nd FOLLOW ON, 3 MONTHS | | | | | | | | | | | | | | | | |
| (11) ATE TEST AND VALIDATION 2nd FOLLOW ON, 3 MONTHS | | | | | | | | | | | | | | | | |
| (10) MASK ORDER, PROCESS WAFERS, 3rd FOLLOW ON, 3 MONTHS | | | | | | | | | | | | | | | | |
| (11) ATE TEST AND VALIDATION 3rd FOLLOW ON, 3 MONTHS | | | | | | | | | | | | | | | | |
| PRODUCTION, LEAD CHIP | | | | | | | | | | | | | | | | |
| PRODUCTION, FULL FAMILY | | | | | | | | | | | | | | | | |

(Related Art)

| TASK | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
|---|---|---|---|---|---|---|---|---|---|---|---|---|---|---|---|---|---|---|---|---|---|---|
| MULTIPLE DEVICE DEVELOPMENT USING STANDARD FLOW | | | | | | | | | | | | | | | | | | | | | | |
| (1) WRITE SPECIFICATION, 3 MONTHS | | ▨ | | | | | | | | | | | | | | | | | | | | |
| (2) DESIGN BLOCKS, 6 MONTHS | | | | ▨ | ▩ | ▩ | ▩ | | | | | | | | | | | | | | | |
| (3) LAYOUT BLOCKS, 3 MONTHS | | | | | | | | ▨ | | | | | | | | | | | | | | |
| (4) ASSEMBLE CHIP AND VERIFY, 4 MONTHS | | | | | | | | | | ▨ | | | | | | | | | | | | |
| (5) MASK ORDER, PROCESS WAFERS, LEAD CHIP OUT, 3 MONTHS | | | | | | | | | | | | | ▨ | | | | | | | | | |
| (6) ATE TEST AND VALIDATION, 6 MONTHS | | | | | | | | | | | | | | | ▩ | | | | | | | |
| (7) FIND BUGS, 2nd MASK ORDER, FAB PROCESSING, 3 MONTHS | | | | | | | | | | | | | | | | | ▩ | | | | | |
| (8) PHASE TWO TESTING, 2 MONTHS | | | | | | | | | | | | | | | | | | | ▨ | | | |
| ENGINEERING SAMPLES AVAILABLE | | | | | | | | | | | | | | | | | | | | | | |
| (9) RUN SPLIT LOTS, RUN QA AND RELIABILITY RUNS, 6 MONTHS | | | | | | | | | | | | | | | | | | | | | | |
| (10) MASK ORDER, PROCESS WAFERS, 1st FOLLOW ON, 3 MONTHS | | | | | | | | | | | | | | | | | | | | | | |
| (11) ATE TEST AND VALIDATION 1st FOLLOW ON, 3 MONTHS | | | | | | | | | | | | | | | | | | | | | | |
| (10) MASK ORDER, PROCESS WAFERS, 2nd FOLLOW ON, 3 MONTHS | | | | | | | | | | | | | | | | | | | | | | |
| (11) ATE TEST AND VALIDATION 2nd FOLLOW ON, 3 MONTHS | | | | | | | | | | | | | | | | | | | | | | |
| (10) MASK ORDER, PROCESS WAFERS, 3rd FOLLOW ON, 3 MONTHS | | | | | | | | | | | | | | | | | | | | | | |
| (11) ATE TEST AND VALIDATION 3rd FOLLOW ON, 3 MONTHS | | | | | | | | | | | | | | | | | | | | | | |
| PRODUCTION, LEAD CHIP OF 1st FAMILY | | | | | | | | | | | | | | | | | | | | | | |
| PRODUCTION, FULL 1st FAMILY | | | | | | | | | | | | | | | | | | | | | | |

SIMULTANEOUS DEVELOPMENT OF COMPLEMENTARY IC FAMILIES

TECHNICAL FIELD

The present invention relates to integrated circuits, and, more specifically but not exclusively, to the processes of designing, testing, and qualifying of families of integrated circuits, such as field-programmable gate arrays (FPGAs).

BACKGROUND

This section introduces aspects that may help facilitate a better understanding of the invention. Accordingly, the statements of this section are to be read in this light and are not to be understood as admissions about what is prior art or what is not prior art.

In the field of electronics, different applications often require the use of different types of integrated circuits (ICs) having different operating characteristics. For example, handheld electronic devices typically require integrated circuits having a low standby power level in order to conserve the limited amount of battery power available, while computer servers typically require integrated circuits having a high speed in order to achieve required levels of processing and throughput.

In conventional IC technology, there is a trade-off between speed and power. Transistors having a relatively high speed typically have a relatively high standby power level, and transistors having a relatively low standby power level typically have a relatively low speed. As a result, ICs designed for low-power applications, such as for handheld devices, typically have a relatively low speed, and ICs designed for high-speed applications, such as servers, typically having a relatively high standby power level.

The standard approach to developing ICs for low-power applications and ICs for high-speed applications is to implement completely independent design, test, and qualification processes, one unique process for each different application. A family of multiple, different ICs may be developed for each different application, but the different families are developed separately from one another. Within an IC family, there is typically a lead IC and one or more follow-on ICs that differ from the lead IC in floorplan, size, and content, but use a common set of circuits and blocks. Some sharing of internal blocks, like PLL (phase-locked loop) or memory blocks or IO (input/output), between different IC families may be implemented, but the floorplan, top layout, verification, assembly, test, QA (quality assurance), and reliability for the different families follow from separate development efforts.

SUMMARY

Instead of implementing separate and independent processes for developing families of integrated circuits for different applications, two or more different, but complementary families of ICs can be developed simultaneously within a common framework such that block-level layouts, top-level device layouts, top-level assembly procedures, test benches, ATE (automatic test equipment) test vectors, pinout, packages, verification scripts, reliability testing, ESD (electrostatic discharge), etc., may all be shared and developed in common.

In one embodiment, the present invention is a method for making at least first and second families of integrated circuits (ICs), wherein the first family has performance characteristics different from the second family, the method comprising (a) providing a common layout for the at least first and second families; (b) specifying a first value for a first IC design parameter, such that one or more ICs of the first family are fabricated based on the first selected value for the first IC design parameter; and (c) specifying a second value, different from the first value, for the first IC design parameter, such that one or more ICs of the second family are fabricated based on the second selected value for the first IC design parameter, wherein the one or more ICs of the first family have the common layout but performance characteristics different from the one or more ICs of the second family.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

DETAILED DESCRIPTION

In conventional IC technology, different design features of a transistor affect the performance characteristics of that transistor. In general, the speed and power of a transistor can be selected by controlling specific design features that affect the threshold voltage (Vt) level, the leakage, and the drive current of the transistor. For example, transistors having higher threshold voltage (Vt) levels typically operate at lower standby power levels and lower speeds than transistors having lower Vt levels. The Vt level of a transistor can be selected by designing the transistor to have an appropriate type and amount of dopant.

It is possible to design two or more different families of integrated circuits for different applications having the exact same layout, where the only difference between the different families is in the Vt levels of at least some (and possibly all) of the transistors in the ICs. As used herein, the term "layout" refers to the geometry and artwork comprising the levels and mask layers that define the physical implementation of the transistors, implants, wires, guardrings, vias, contacts, etc., that make up the physical view of the circuits. In particular, two IC families, the first a family of low-power ICs and the second a family of high-speed ICs, can be designed to have the same, or common, layout, where, in the first family, a number of transistors have relatively high Vt levels, while the corresponding transistors in the second family have relatively low Vt levels. In that case, the set of masks used to fabricate the first family of ICs can be substantially identical to the set of masks used to fabricate the second family of ICs, where the two sets of masks might differ by only a very small number of masks (e.g., one to five masks) that are associated with achieving the different Vt levels.

Controlling the Vt level is just one way of achieving different, specific operating characteristics at the transistor level and thereby different, overall operating characteristics at the IC level. Other variable design parameters include, without limitation, the thickness of the transistor gate oxide (where thicker implies lower power and lower speed), the length of the transistor channel (where longer implies lower power and lower speed), the type of pocket implant, and the type of extension implant.

For example, in one possible implementation, relatively low Vt levels can be achieved using a pocket implant of In+ (Indium) and an extension implant of As+ (Arsenic), while relatively high Vt levels can be achieved using a pocket implant of B+ (Boron) and an extension implant of P+/As+ (Phosphorus/Arsenic combination). The Phosphorus extension helps to achieve a high-Vt device. Those skilled in the art will understand that other implementations can be based on other combinations of pocket implants and/or extension implants.

Note that, when channel length is a variable design parameter, the common layout for the different IC families would be designed to accommodate the longest of the channel lengths at play, where the poly level that defines the transistor channel length for each family would be excluded from the term "common layout." For example, the slow speed/low power family may use a channel length of 70 nm, while the high performance/high power family may use 60 nm channel lengths. In this case, the circuit layouts would be executed to the larger of the two dimensions, i.e., 70 nm, and all layout design rules verified and satisfied against the 70 nm rule. Then, for the high-speed family, a comparable CAD (Computer-Aided Design) switch would change the selected 70 nm channel lengths to the reduced 60 nm channel lengths.

Generally, given two separate system design specifications, one for low standby power with limited system performance and the other for high system performance with large standby power, IC designers will create two different, fully optimized circuits for the two distinct cases. As an example, the low-power circuit-may use longer, smaller (i.e., narrower) transistors with high Vt implants, while the high-performance circuit-may use shorter channel length, physically wider transistors with low Vt activation levels for high Idsat drive strength and speed. The typical practice is to employ fully the transistor length, width, and circuit design changes, resulting in unique layouts, and a more serial approach to design, fabrication, test, and verification. Invariably, physical layouts reflect the design differences resulting in two very distinct layouts having little in common, except for potentially being logically identical.

Certain embodiments of the present invention limit normal design practice to only Vt changes, enforcing a common layout for all other design parameters that normally would be fully optimized. This produces a near common mask set, saving substantially the mask set costs. It also enforces a design requirement for simultaneous design of both families leading to an overall reduction in project costs and time to market. Designing, testing, qualifying, and verifying two IC families to serve two distinct market segments simultaneously, reduces development costs, improves time to market, and broadens each IC family's market penetration. This is achieved by enforcing the restriction of common layout limited solely to change of implant between IC families which is not normal practice for IC design.

Vastly different market segments can be served with IC families with dramatic difference in speed/power characteristics by means of Vt-only mask changes provided a common layout principle is followed and the CAD (computer-aided design) flow is designed appropriately to support the Vt switch. The invention enables cost savings in mask set costs as well as development costs due to collapsed, parallel development efforts resulting in reduced development schedules.

According to certain embodiments of the present invention, a first, low-power family of ICs and a second, high-speed family of ICs are developed simultaneously such that the two different, but complementary families have the same layout and share most of the same masks used in fabricating the ICs of the two different families. In some low-power applications, handheld devices require standby currents in the nano-amp to micro-amp range as a primary system requirement, while typically having reduced internal speed requirements. In some high-speed applications, servers require much faster internal speeds but allow for several orders of magnitude higher standby currents.

Figure 1:
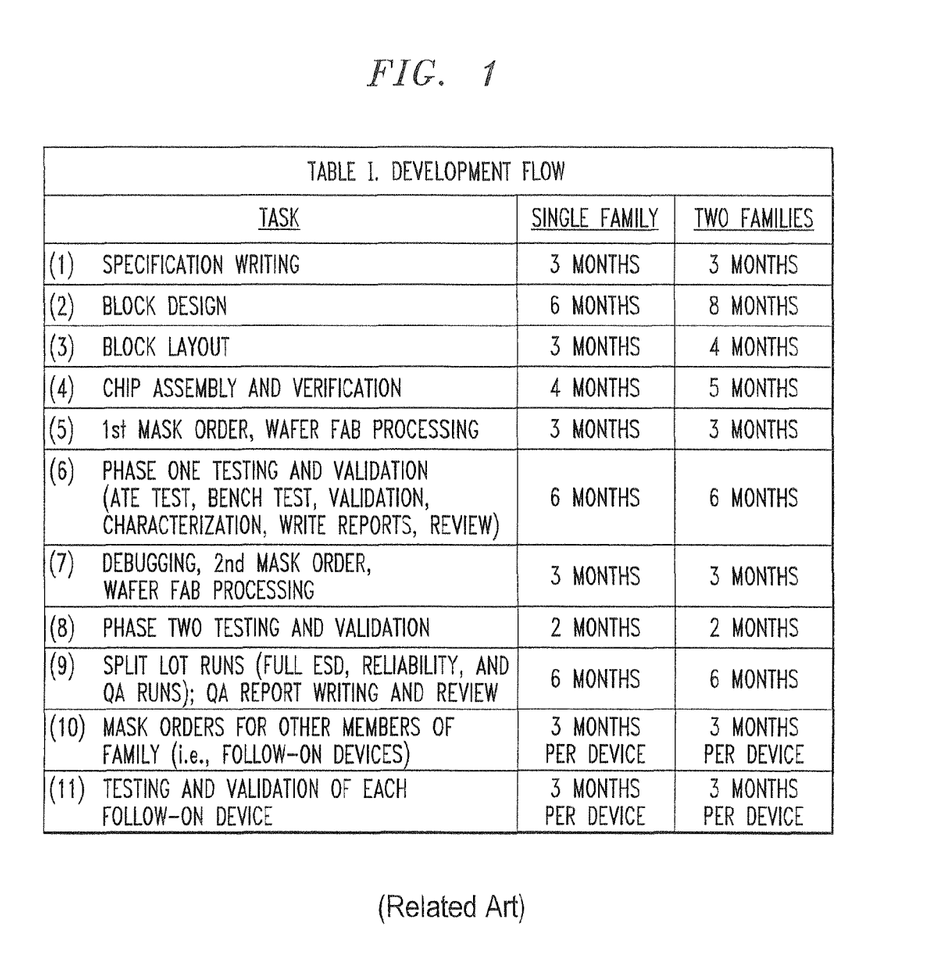
FIG. 1 presents Table I, which identifies the tasks involved in an exemplary development of IC families.

FIG. 1 presents Table I, which identifies the tasks involved in an exemplary development of IC families with a comparison of the typical amount of time that it takes for each of the tasks when developing a single family of ICs vs. the simultaneous development of two complementary families of ICs: one for low-power applications and one for high-speed applications. As indicated in this table, certain tasks (e.g., block design, block layout, and IC assembly and verification) take longer when simultaneously developing two complementary IC families than for a single IC family because of the restriction to use implant-only changes to meet different market objectives placed on the IC designer.

Figure 2:
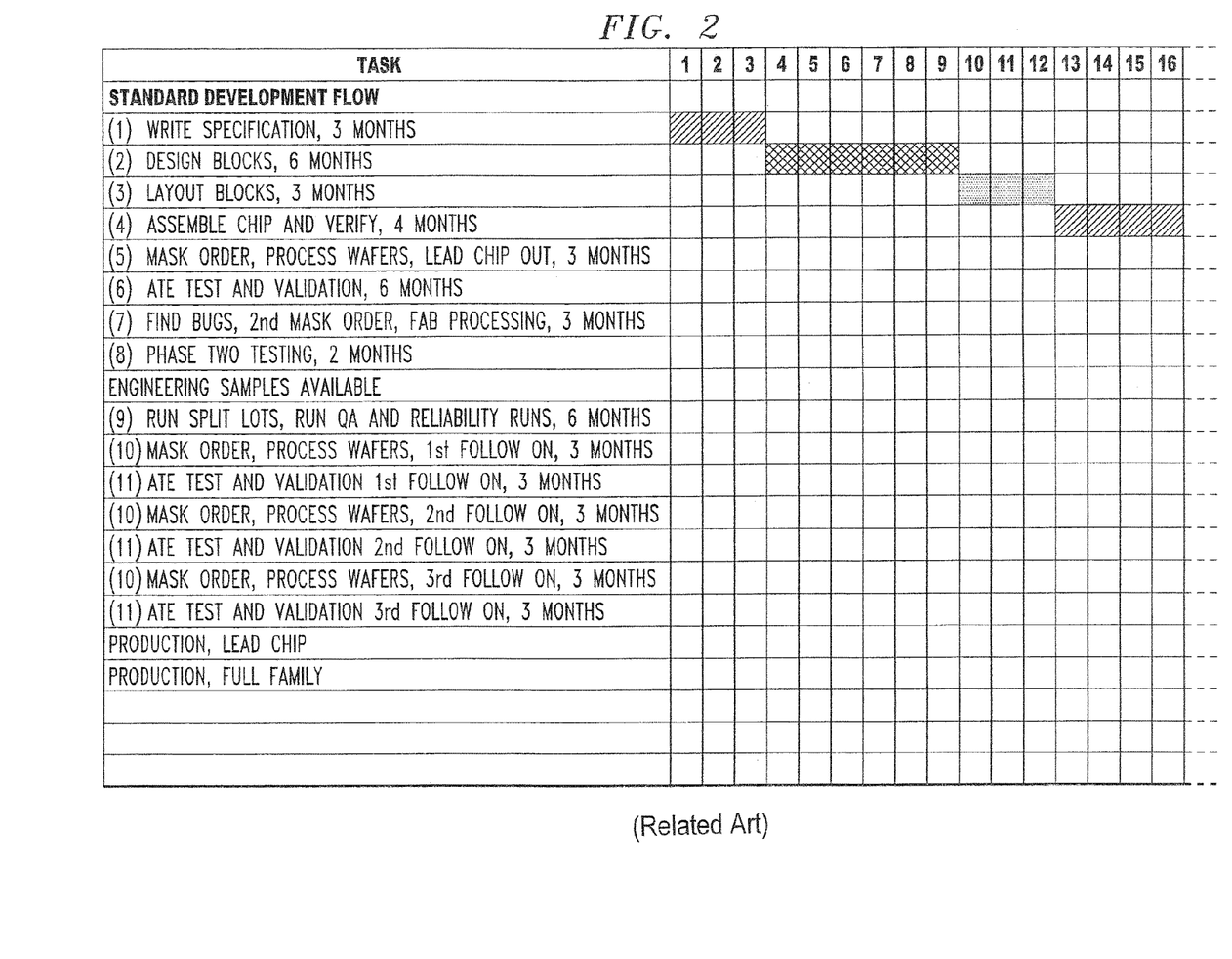
FIG. 2 shows an exemplary timeline for the conventional development of a single IC family.

FIG. 2 shows an exemplary timeline for the conventional development of a single IC family having four different ICs in the family: a lead IC and three follow-on ICs. Note that certain tasks can overlap in time. For example, as indicated in FIG. 2, phase one testing and validation (Task 6) of the lead IC can be implemented during the wafer fabrication processing of the first mask order (Task 5) for the lead chip. As another example, as also indicated in FIG. 2, the wafer processing (Task 10) for the mask order for the second follow-on IC can be performed during the testing and validation (Task 11) for the first follow-on IC and can even be started to overlap with the tail end of the wafer processing (Task 10) for the second follow-on device. According to this exemplary timeline, the full family of ICs are ready for production after a total development time of 40 months.

Figure 3:
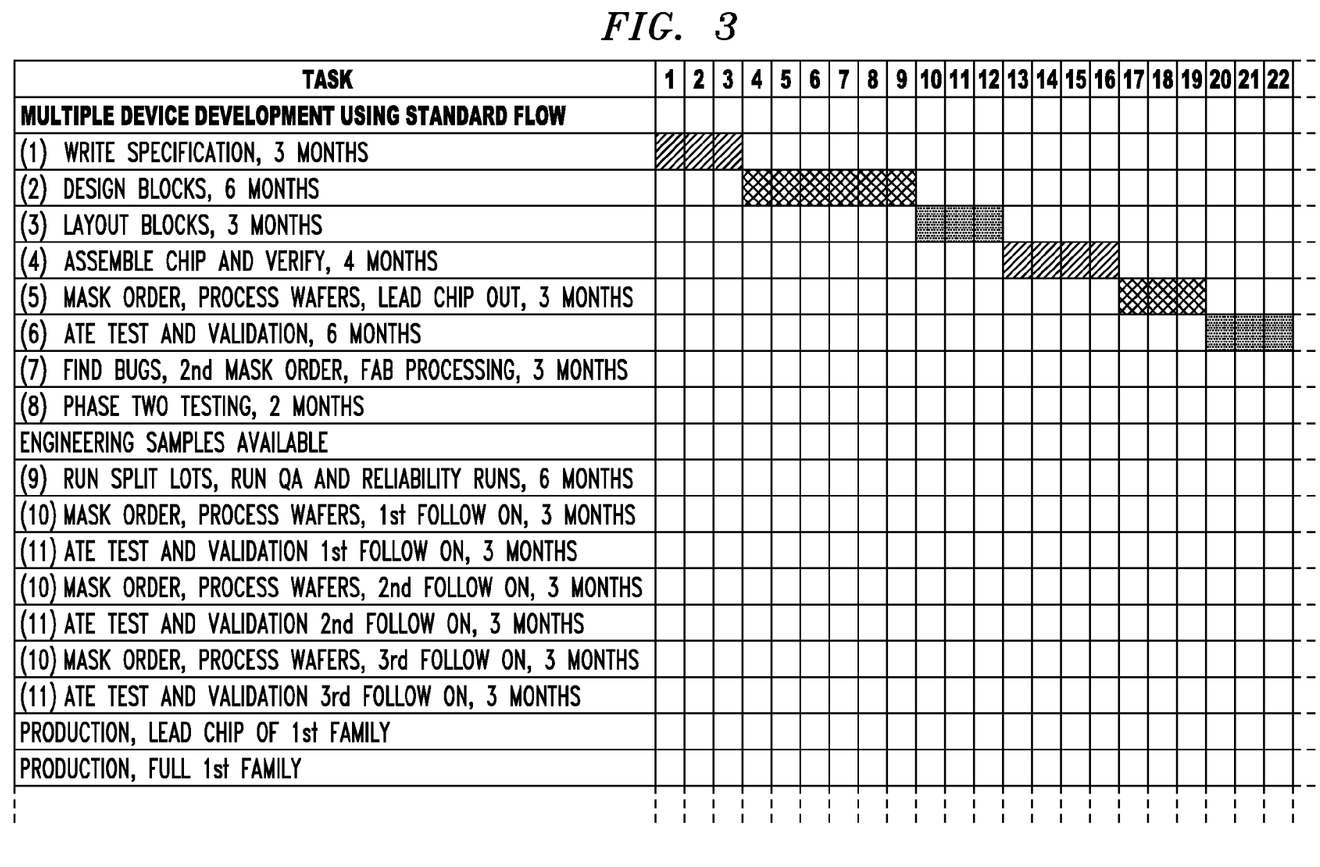
FIG. 3 shows an exemplary timeline for the conventional, independent development of two different IC families.

FIG. 3 shows an exemplary timeline for the conventional, independent development of two different IC families, each having four different ICs in the family. In this case, in addition to different tasks overlapping in time within the development for each family, the development of the second family can be initiated before the completion of the development of the first family. In particular, as indicated in FIG. 3, the specification writing (Task 1) for the second family can begin during the wafer fabrication processing for the first mask order (Task 5) for the first family. According to this exemplary timeline, the first full family of ICs are ready for production after the same 40-month development time as in FIG. 2, while both full families of ICs are not ready for production until after a total development time of 61 months.

Figure 4:
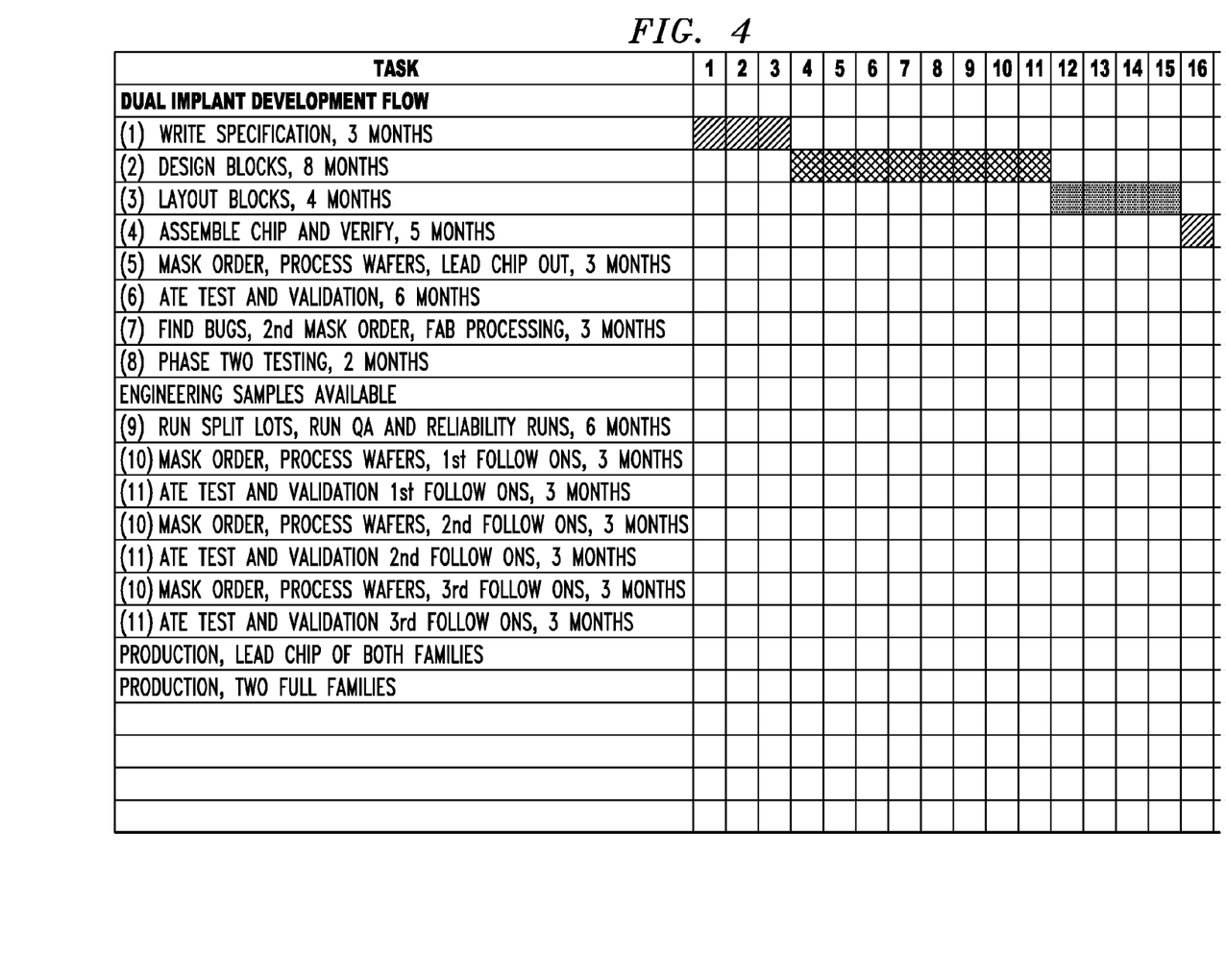
FIG. 4 shows a corresponding exemplary timeline for the simultaneous development of two different, but complementary IC families analogous to the two IC families of FIG. 3.

FIG. 4 shows a corresponding exemplary timeline for the simultaneous development of two different, but complementary IC families analogous to the two IC families of FIG. 3, each family having four different chips. In this case, as indicated in Table I of FIG. 1, certain tasks (e.g., Tasks 2, 3, and 4) take longer when developing two complementary families simultaneously. However, in this case, the overall development time for both full families of ICs is only 44 months, a significant 17-month reduction in development time as compared to the conventional 61-month duration of FIG. 3. Project costs typically align with project development time.

According to the simultaneous development of FIG. 4, both families are developed within a common framework such that block-level layouts, top-level device layouts, top-level assembly procedures, test benches, ATE test vectors, pinout, packages, verification scripts, reliability testing, ESD, etc., may all be shared and developed in common.

For two complementary families that differ only in the Vt levels of at least some of their transistors, the layouts and various components of the development framework are common with the exception of the mask layers that define the implant layers used to define those Vt levels. These implant layers may be referred to as "dual implant" layers, where, in a low-power device, the core transistor implants are set to high Vt for low-power, but low-speed transistor types, while, in a complementary, high-speed device, the core transistor implants are set to low Vt for high-speed, but high-power transistor types. Hence, they are dual mode implants. Depending on the target system or market, i.e. high performance or low power, the implant mask levels are set appropriately to achieve the desired speed/power customization.

The personalization of the entire IC is managed by an implant switch implemented in the CAD (computer-aided design) flow and transistor models. The global switch between low-power transistors and high-speed transistors modifies the nature of the entire device and the market segment it serves.

Up front, from the very beginning of the design, critical circuits are labeled and tagged for the CAD flow as being "dual implant." The transistor implant defines the transistor's Vt and Idsat (saturation current) behavior defining the speed/power for that specific transistor. Dual implant technology applies a principle of switching implants across an entire IC based on a global switch in the mask realization process. This implies that, for the low-power devices, these transistors will be defined to be the high-Vt, low-power implant transistor type, while, for high-speed products, the dual implant tagged transistors will be defined to be the low-Vt, high-speed implant transistor type.

The entire chip's system performance is defined by the implant change, not just at the subcircuit level. Because the entire IC system behavior is impacted, all timing simulations and system verification must comprehend the dual implant nature of the timing and power from the beginning of product development in a complete, chip-level context. For instance, circuits critical to speed are fully simulated under both implant options to verify performance metrics such as jitter, duty cycle, switching points, stability, intrinsic delay, extrinsic delay, etc., using both implant options and in the context of the entire IC switching its implant nature from low power to high speed.

The IC designers through transistor models simulate the implant switch of the entire device as a system and verify that the system timing and power of the IC meet the specific needs of the market requirement.

The CAD flow, the up-front simulation of both environments, and the system-level analysis of the context switch are important differentiations of the development flow on the front end. On the back-end test and verification, many procedures, processes, scripts, and vectors can be re-used and shared greatly benefiting both schedule and cost. The implant change is across major portions of the chip, creating in effect a new product class, but only when designed up front to be consistent within itself and within the system requirements for each product.

Figure 5:
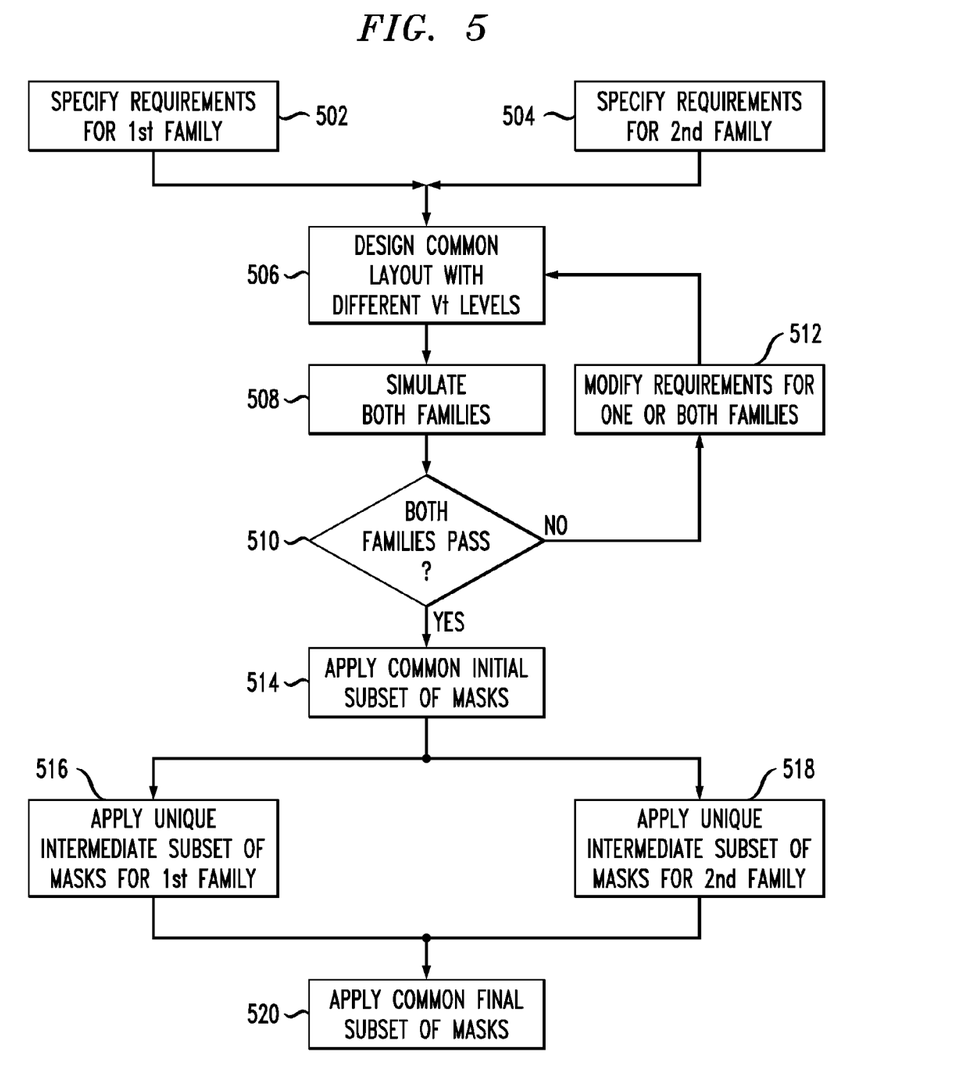
FIG. 5 presents an exemplary, high-level flow diagram of some of the processing involved in simultaneously developing two complementary IC families.

FIG. 5 presents an exemplary, high-level flow diagram of some of the processing involved in simultaneously developing two complementary IC families, in which the first family consists of low-power ICs and the second family consists of high-speed chips, where complementary ICs in different families differ only in the Vt levels of at least some of their transistors. In FIG. 5, steps 502-512 may be implemented using conventional CAD tools running on a computer, where different appropriate tools may be needed to implement particular steps, while step 514-520 may be implemented at a semiconductor fabrication facility. In steps 502 and 504, the different sets of requirements are specified for the first and second families, respectively. In this exemplary case, the requirements for the first (low-power) family would include, among other requirements, appropriate low-power constraints, and the requirements for the second (high-speed) family would include, among other requirements, appropriate high-speed constraints.

In step 506, based on the two different sets of requirements for the two different families, a common IC layout is designed, and the Vt levels are specified for each transistor in each family. In step 508, simulations are performed for both families based on the common IC layout and the respective, differing Vt levels.

If, in step 510, the simulations indicate that both families do not satisfy their respective sets of requirements, then the requirements for one or both of the families are possibly modified in step 512, and the Vt levels and/or the layout itself are modified in step 506 based on the modified requirements. The modified designs for the two families are then re-simulated in step 508 and re-evaluated in step 510. This iterative process of modifying requirements and designs followed by re-simulating and re-evaluating the modified designs is repeated until both families pass their respective sets of requirements in step 510.

The resulting common layout with different Vt levels for the two different families is represented by four different subsets of masks used to fabricate the ICs of the two different families: a common initial subset of masks that is used for both families, a unique intermediate subset of masks that is used only for the first family, a different, unique intermediate subset of masks that is used only for the second family, and a common final subset of masks that is used to both families. The application of these four subsets of masks is reflected in FIG. 5 as follows.

In step 514, the common initial subset of masks is applied for all ICs of both families to produce identical partially fabricated ICs for both families. In step 516, the unique intermediate subset of masks is applied to just the partially fabricated ICs from step 514 for the first family to produce partially fabricated ICs having the higher Vt levels, while, in step 518, the different, unique intermediate subset of masks is applied to just the partially fabricated ICs from step 514 for the second family to produce partially fabricated ICs having the lower Vt levels. In step 520, the common final subset of masks is applied to all partially fabricated ICs from steps 516 and 518 to produce the completed ICs for both families.

Depending on the particular implementation, the number of masks in the two different, unique, intermediate subsets for the two families may be the same or different, including the possibility that one of the intermediate subsets is empty. This might result, for example, from a situation in which one IC family is fabricated using a particular dopant level to achieve its Vt level, while the other IC family achieves its Vt level without any doping. In that case, the latter family's unique subset of masks may be empty.

In order to enable faster validation and characterization testing of the different members of the two different families, a combination ("combo") reticle can be fabricated in which different dice of the reticle are assigned to different members of the different families. A reticle as referenced here is an X by Y matrix of ICs that are simultaneously processed during the fabrication process and is common practice in the semiconductor fabrication field. This "combo" reticle is stepped across the entire wafer as it is fabricated and can provide all the versions of the product on the same wafer. As a result, this reduces the number of wafers that need to be fabricated (and the corresponding cost) since all products are fabricated at the same time and available at the same time. In addition to this "combo" wafer that contains all or some versions of the product, there can also be a 'production' reticle produced that is limited to as few as one of the product versions.

In the field of semiconductor design and development, once the silicon wafers have been fabricated, they typically go through a 'sorting' process that uses automated test equipment to test each unique IC while still in wafer form. In the example cited above, within each reticle frame, there will be more than one product type that requires unique testing.

In addition, there exists the option of having internally voltage regulated versions and un-regulated versions of the same products. As an example, a regulated device can use external voltages from 1.8V to 3.6V, while controlling the internal voltage on the device to 1.2V. An un-regulated version of the product would use only an external voltage of 1.2V. This option is can be 'optioned' in or out with a metal mask.

As has been described earlier, each version or family of the product has its own unique set of product parameters that are verified as functional and meeting some specific set of requirements. As a result, a single testing sort flow test program cannot be used as is the normal practice in the semiconductor industry. Thus, a means of uniquely identifying each family member of the product has been developed in order to dynamically select the appropriate different set of tests for each unique version of the product.

One possible method is to have internal 'hardwired' bits in the product that can be read from the device. These bits uniquely identify not only the product type but also the correct voltage to be used for the family in order to function properly, even when an improper voltage level may be currently applied. One means of accomplishing this can be to have the hardwired bits always require a 'transition' state to be valid. For example, a sequence of 4 bits of all "1"s or all "0"s would not be a valid state, while any other sequence of bits would indicate a potential valid stated (e.g., "1011" could be valid). The establishment of all "1"s or all "0"s as invalid states is to prevent a failing IC with stuck high or low bits being recognized as valid. Alternating bits indicate a somewhat functional IC.

The steps for verifying the bits would be as follows:
1) Apply the lowest common voltage for an unregulated device (e.g., 1.2V) and attempt to read a valid sequence of bits from the device.
   a. If a valid sequence is found,
      i. This means that the device is an unregulated device.
      ii. Branch to the testing software appropriately for that product version.
   b. If an invalid sequence is read, go to step 2.
2) Apply the next highest level of voltage (for a regulated device) to the device and attempt to read a valid sequence of bits from the device.
   a. If a valid sequence is found,
      i. This means that the device is a regulated device.
      ii. Branch to the testing software appropriately for that product version.
   b. If an invalid sequence is read, go to step 3.
3) Device fails to read a valid ID for either regulated or unregulated versions of the device and thus is a failing IC and should be discarded.

Although the present invention has been described in the context of two IC families having four ICs each, the invention is not so limited. In general, the present invention can be applied to two or more different, but complementary IC families, where each family has one or more ICs and where different families may have the same or different numbers of ICs as other families. For example, in addition to a low-power family and a high-speed family, there may be one or more other families having intermediate levels of power and speed achieved using transistors having intermediate Vt levels.

The present invention can be implemented in the context of any suitable type of integrated circuit device, such as, without limitation, application-specific integrated circuits (ASICs), field-programmable gate arrays (FPGAs), programmable logic devices (PLDs), mask-programmable gate arrays (MPGAs), simple programmable logic devices (SPLDs), and complex programmable logic devices (CPLDs).

It should be appreciated by those of ordinary skill in the art that any block diagrams herein represent conceptual views of illustrative circuitry embodying the principles of the invention. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Unless explicitly stated otherwise, each numerical value and range should be interpreted as being approximate as if the word "about" or "approximately" preceded the value of the value or range.

It will be further understood that various changes in the details, materials, and arrangements of the parts which have been described and illustrated in order to explain the nature of this invention may be made by those skilled in the art without departing from the scope of the invention as expressed in the following claims.

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the present invention.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

What is claimed is:

1. A method for fabricating at least a first family and a second family of integrated circuits (ICs), the method comprising:
    providing a common layout for at least the first family and the second family;
    specifying a first value for an IC design parameter, wherein the first value of the IC design parameter controls an IC performance characteristic;
    fabricating one or more ICs of the first family based on the common layout and the specified first value;
    specifying a second value for the IC design parameter which is different from the specified first value; and
    fabricating one or more ICs of the second family based on the common layout and the specified second value,
    wherein the one or more ICs of the first family and the one or more ICs of the second family have the common layout but their performance characteristics are different.

2. The method of claim 1, wherein power and speed an IC of the first family are lower than that of a corresponding IC of the second family.

3. The method of claim 2, wherein the IC of the first family and the corresponding IC of the second family have a same core size.

4. The method of claim 2, wherein:
    the IC of the first family has one or more transistors having a first threshold voltage (Vt) level; and
    the corresponding IC of the second family has one or more corresponding transistors having a second Vt level that is lower than the first Vt level.

5. The method of claim 1, wherein the IC design parameter is a transistor threshold voltage (Vt).

6. The method of claim 5, wherein the specified first value for a transistor Vt and the specified second value for a transistor Vt are achieved by using different concentrations of dopants.

7. The method of claim 5, wherein the specified first value for a transistor Vt and the specified second value for a transistor Vt are achieved by using different types of dopants.

8. The method of claim 1, wherein the IC design parameter is a type of pocket implant.

9. The method of claim 1, wherein the IC design parameter is a type of extension implant.

10. The method of claim 1, wherein the IC design parameter is a transistor channel length.

11. The method of claim 1, wherein the IC design parameter is a transistor gate oxide thickness.

12. The method of claim 1 further comprising:
    providing the common layout for at least a third family of ICs;
    specifying a third value for the IC design parameter which is different from the specified first value and the specified second value; and
    fabricating one or more ICs of the third family based on the common layout and the specified third value;
    wherein the one or more ICs of the first family, the one or more ICs of the second family, and the one or more ICs of the third family have the common layout but their performance characteristics are different.

13. The method of claim 1, wherein:
    the first family comprises ICs of two or more different sizes; and
    the second family comprises ICs of two or more different sizes.

14. The method of claim 1, wherein the providing a common layout for at least the first family and the second family comprises selecting between different possible transistor sizes for one or more transistors to trade off between speed and power consumption in order to provide the common layout.

15. The method of claim 1, wherein:
    a first set of masks is used to fabricate an IC of the first family; and
    a second set of masks is used to fabricate an IC of the second family,
    wherein most of the masks in the first set are identical to corresponding masks in the second set.

16. The method of claim 1, wherein:
    (1) an initial set of masks is applied to produce partially fabricated ICs for the first and second families;
    (2) a unique set of masks is applied to some of the partially fabricated ICs from (1) to produce partially fabricated ICs for the first family;
    (3) a different, unique set of masks is applied to other of the partially fabricated ICs from (1) to produce partially fabricated ICs for the second family; and
    (4) a final set of masks is applied to the partially fabricated ICs from (2) and (3) to produce completely fabricated ICs for the first and second families.

17. The method of claim 1, wherein a combo reticle is fabricated comprising one or more ICs of the first family and one or more ICs of the second family.

18. One or more integrated circuits designed using the method of claim 1.

19. The integrated circuits of claim 18, wherein the one or more integrated circuits comprise a first IC of the first family and a second IC of the second family.

20. The method of claim 1, further comprising uniquely identifying each family member for testing purposes.

21. A system for designing at least a first family and a second family of integrated circuits (ICs), wherein performance characteristics of the first family are different from that of the second family, the system comprising:
    means for designing a common layout for at least the first family and the second family;
    means for specifying a first value for an IC design parameter, wherein one or more ICs of the first family are fabricated based on the specified first value; and
    means for specifying a second value for the IC design parameter which is different from the specified first value, wherein one or more ICs of the second family are fabricated based on the specified second value,
    such that the one or more ICs of the first family and the one or more ICs of the second family have the common layout but their performance characteristics are different.

22. A method for fabricating at least a first family and a second family of integrated circuits (ICs), the method comprising:
    applying a common set of masks to a wafer to produce partially fabricated ICs identical for the first and second families;

applying a first unique set of masks only to the partially fabricated ICs for the first family to produce partially fabricated ICs unique for the first family; and applying a second unique set of masks only to the partially fabricated ICs for the second family to produce partially fabricated ICs unique for the second family.

23. The method of claim 22 further comprising, after applying the first unique set of masks and the second unique set of masks, applying another common set of masks to the partially fabricated ICs for the first and second families.

24. The method of claim 23, wherein:

the common set of masks is an initial set of masks;

the first and second unique sets of masks are intermediate sets of masks and are the only intermediate sets of masks; and the other common set of masks is a final set of masks.

25. The method of claim 22, wherein the first unique set of masks produces partially fabricated ICs having a higher threshold voltage (Vt) level and the second unique set of masks produces partially fabricated ICs having a lower threshold voltage (Vt) level.

\* \* \* \* \*